(12) United States Patent
Chen

(10) Patent No.: US 6,659,803 B1
(45) Date of Patent: Dec. 9, 2003

(54) POWER SUPPLY ARRANGEMENT FOR SERVER

(75) Inventor: Feng-Ming Chen, Yung Ho (TW)

(73) Assignee: Chenbro Micom Co., Ltd., Taipei Hsien (TW)

(*) Notice: Subject to any disclaimer, the term of this patent is extended or adjusted under 35 U.S.C. 154(b) by 0 days.

(21) Appl. No.: 10/200,744

(22) Filed: Jul. 24, 2002

(51) Int. Cl.⁷ .............................................. H01R 27/00
(52) U.S. Cl. ........................ 439/638; 439/76.1; 439/65
(58) Field of Search ........................ 439/65, 76.1, 638, 439/67, 77

(56) References Cited

U.S. PATENT DOCUMENTS

| | | | | |
|---|---|---|---|---|
| 5,567,180 A | * | 10/1996 | Seo ............................ | 439/638 |
| 5,748,443 A | * | 5/1998 | Flint et al. .................. | 439/638 |
| 6,011,319 A | * | 1/2000 | Kelly et al. ................ | 439/76.1 |
| 6,046,912 A | * | 4/2000 | Leman ........................ | 439/638 |
| 6,050,831 A | * | 4/2000 | Wu et al. .................... | 439/638 |
| 6,106,307 A | * | 8/2000 | Goslicki, Jr. et al. ...... | 439/76.1 |
| 6,122,175 A | * | 9/2000 | Shieh .......................... | 439/76.1 |
| 6,132,223 A | * | 10/2000 | Seeley et al. .............. | 439/76.1 |
| 6,159,022 A | * | 12/2000 | Tsai ............................ | 439/76.1 |
| 6,445,595 B2 | * | 9/2002 | Okamoto .................... | 439/76.1 |
| 6,454,572 B1 | * | 9/2002 | Konetski et al. ........... | 439/76.1 |

* cited by examiner

*Primary Examiner*—Gary Paumen
(74) *Attorney, Agent, or Firm*—Bacon & Thomas, PLLC

(57) ABSTRACT

A power supply arrangement for server is installed in the case of a server, which uses an adapter board and a power cable to connect a power adapter to the motherboard of the server so that when the power adapter or motherboard failed, a different model of power adapter or motherboard can be used.

1 Claim, 4 Drawing Sheets

POWER SUPPLY ARRANGEMENT FOR SERVER

BACKGROUND OF THE INVENTION

1. Field of the Invention

The present invention relates to a server and, more specifically, to a power supply arrangement for server, which enables the user to replace the power adapter or motherboard with a different model of power adapter or motherboard.

2. Description of the Related Art

An industrial computer server generally comprises a server case, a set of disk drivers, a motherboard, a power adapter, and other requisite component parts. The power adapter has a power output connector connected to a connector of the motherboard through a power cable to provide the motherboard with the necessary working voltage. Different models of power adapter or mother board have a different specification of connector (20Pin, 24PIN, or the like). The specification of the connector of the power adapter should match the specification of the connector of the motherboard. Therefore, a server uses a particular model of power adapter. When the power adapter of a server failed, the failed power adapter must be replaced with a same model of power adapter. This limitation causes numerous drawbacks as outlined hereinafter.

1. The supplier should prepare different models of power adapter and bus lines to fit different models of motherboard, and a particular model of power adapter and bus line should be used to match with a particular model of motherboard.
2. When the power adapter of the server failed and the model of the failed power adapter no longer available, the server becomes useless.
3. When the parts of the server changed, the power adapter, motherboard and connectors of the server become useless, and new power adapter, motherboard and connectors must be used.
4. When upgrading the server, the power adapter and the motherboard must be replaced at the same time, resulting in high upgrading cost.
5. When the power adapter or motherboard of the server failed, only the same model of power adapter or motherboard can be used as a substitute.

SUMMARY OF THE INVENTION

The present invention has been accomplished under the circumstances in view. It is therefore the main object of the present invention to provide a power supply arrangement for server, which enables the power adapter of the server to be replaced with any of a variety of commercially available models of power adapter when the power adapter failed. It is another object of the present invention to provide a power supply arrangement for server, which enables the motherboard of the server to be replaced with any of a variety of commercially available models of motherboard when upgrading the server. To achieve these and other objects of the present invention, the power supply arrangement for server comprises a power adapter installed in a server case holding a motherboard and adapted for providing power supply to the motherboard, the power adapter having a power output connector; a power cable adapted for transmitting power supply from the power adapter to said motherboard, the power cable having a power connector adapted for receiving power supply from the power adapter and an adapter connector adapted for connecting to a connector of the motherboard to transmit power supply to the motherboard; and an adapter board mounted in said server case, the adapter board having an input-end connector adapted for connecting to the power output connector of the power adapter to transmit power from the power adapter to the power cable and an output-end connector adapted for connecting to the power connector of the power cable to transmit power from the input-end connector to the power cable.

DETAILED DESCRIPTION OF THE PREFERRED EMBODIMENT

Figure 1:
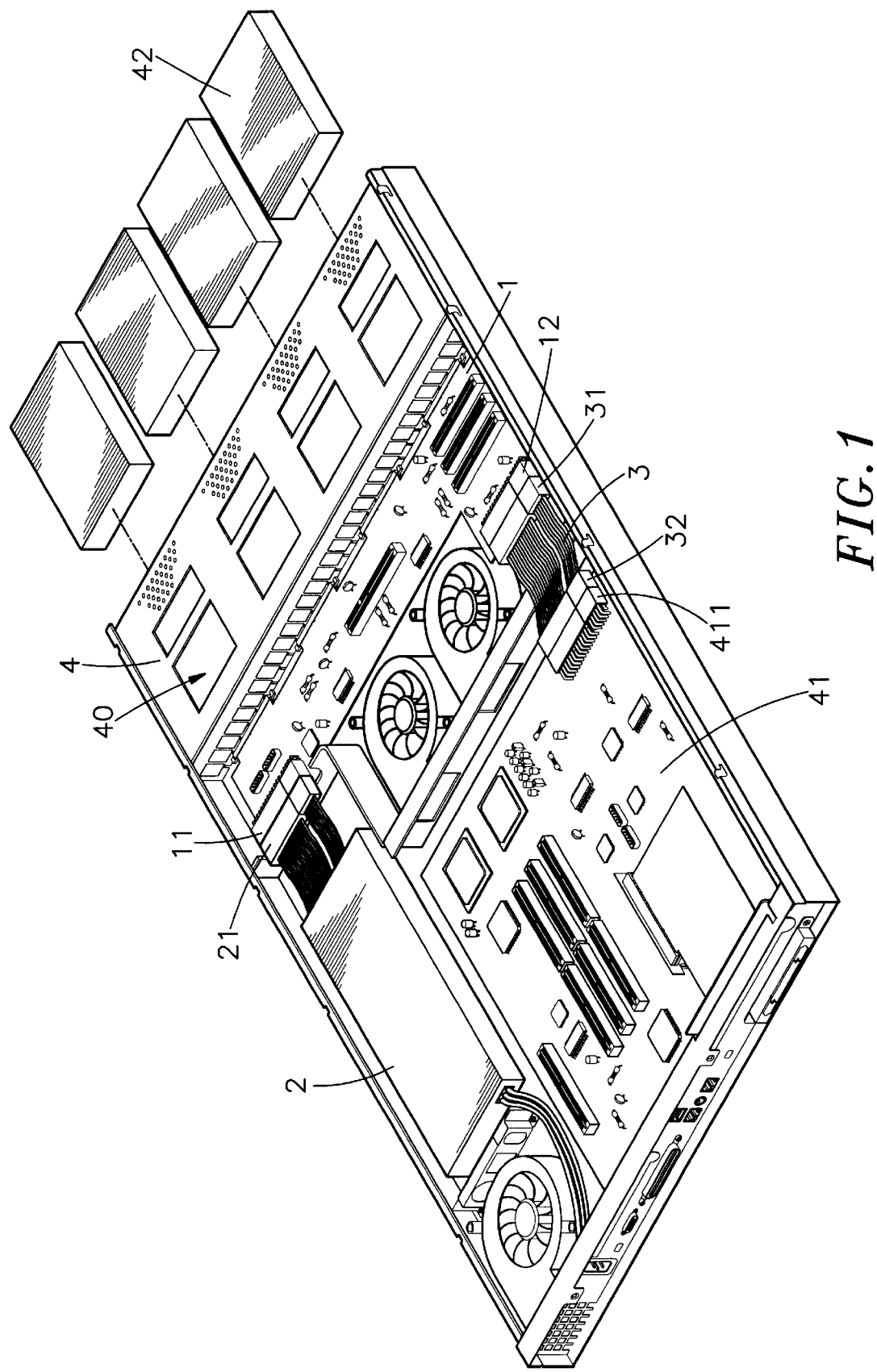
FIG. 1 is a perspective view of a power supply arrangement for server according to the present invention.
Figure 2:
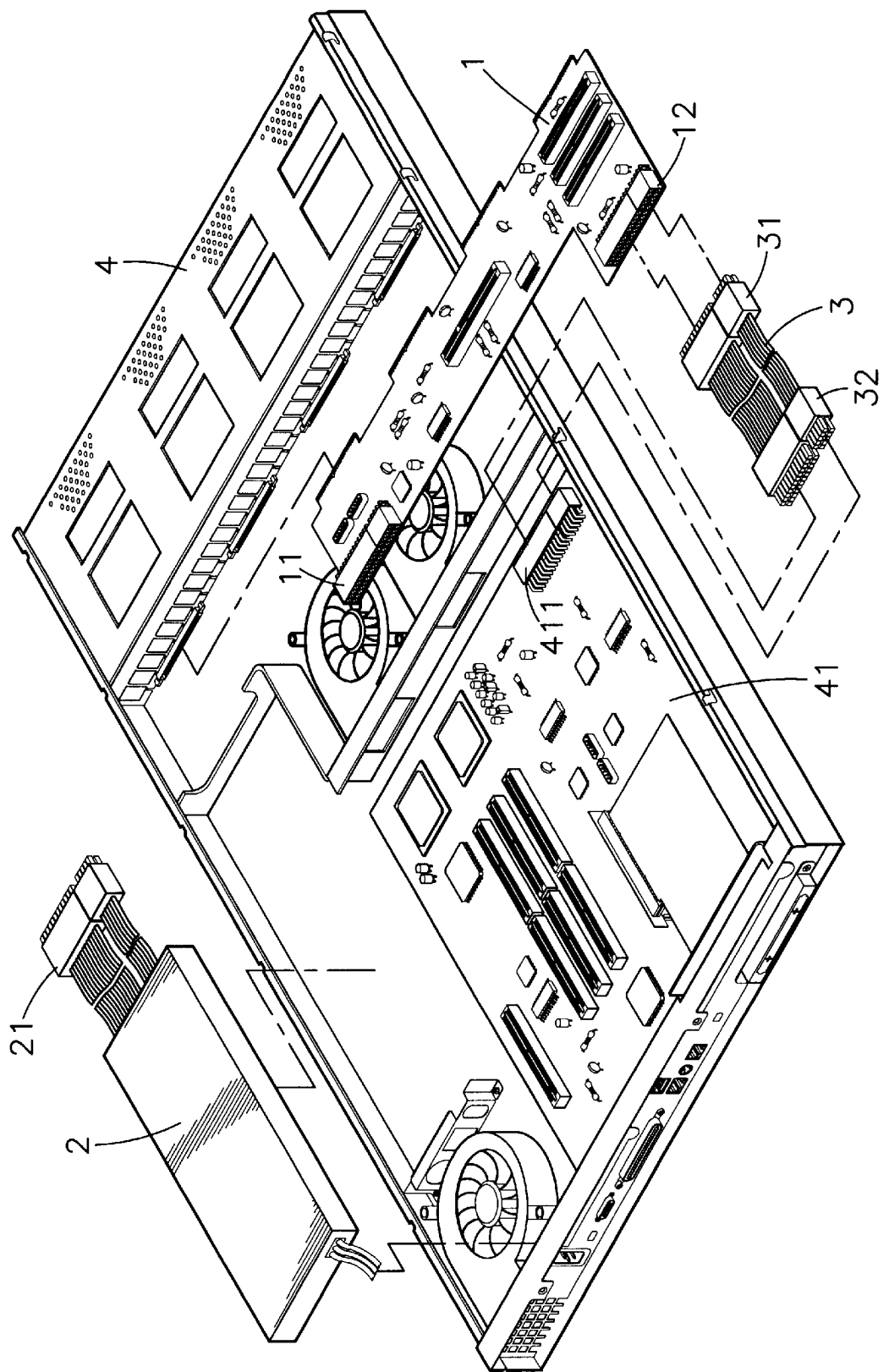
FIG. 2 is an exploded view of the power supply arrangement for server according to the present invention.

Referring to FIGS. 1 and 2, a power supply arrangement for server in accordance with the present invention is generally comprised of an adapter board 1, a power adapter 2, a power cable 3, and a server case 4.

The server case 4 is a case for an industrial server, defining a holding space 40, which holds a motherboard 41 and a number of disk drivers 42. The motherboard 41 has a connector 411. The number of pins of the connector 411 is determined subject to the model of the motherboard 41 (for example, 24PIN, 20PIN, or the like).

The adapter board 1 is installed in the server case 4, having circuits and electronic component parts therein, an input-end connector 11 at one side, and an output-end connector 12 at an opposite side.

The power adapter 2 is mounted in the server case 4, having a power output connector 21. The number of pins of the connector 21 is subject to the model of the power adapter 2 (for example, 24PIN, 20PIN, or the like).

The power cable 3 is adapted for connecting the output-end connector 12 of the adapter board 1 to the motherboard 41 in the server case 4, having a power connector 31 at one end and an adapter connector 32 at an opposite end. The number of pins of the power connector 31 as well as the number of pins of the adapter connector 32 is determined subject to the model of the power adapter 2 (for example, 24PIN, 20PIN, or the like).

The adapter board 1 is fixedly mounted inside the server case 4, keeping the input-end connector 11 connected to the power output connector 21 of the power adapter 2 and the output-end connector 12 connected to the power connector 31 of the power cable 3. The adapter connector 32 of the power cable 3 is connected to the connector 411 of the motherboard 41 in the server case 4. Therefore, power supply is transmitted from the power adapter 2 through the adapter board 1 and the power cable 3 to the connector 411 of the motherboard 41 for the operation of the motherboard 41.

Figure 3:
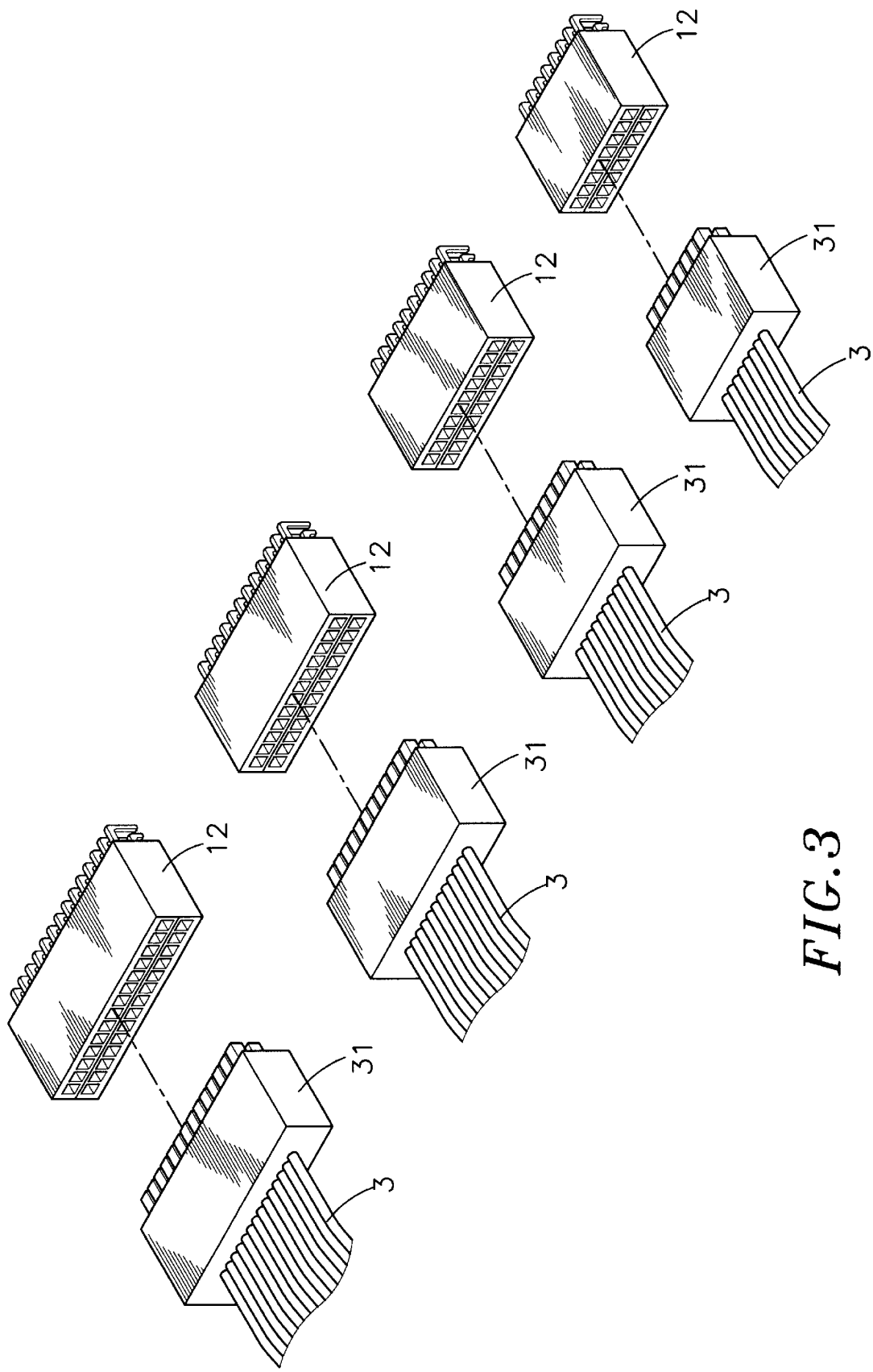
FIG. 3 illustrates different models of output-end connector corresponding to matched modules of power connector according to the present invention.
Figure 4:
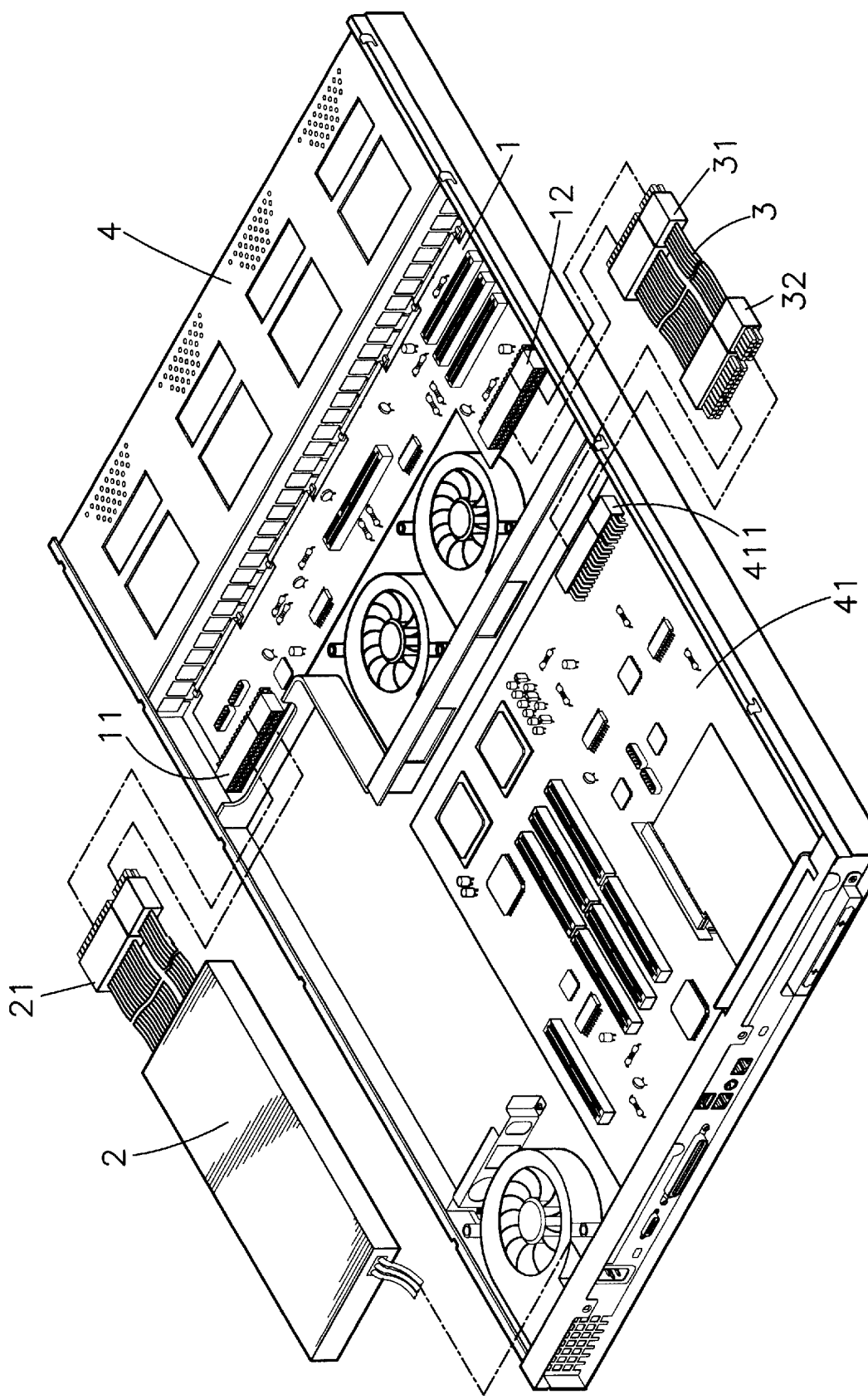
FIG. 4 is another exploded view of the power supply arrangement for server according to the present invention.

Referring to FIGS. 3 and 4 and FIG. 2 again, the input-end connector 11 of the adapter board 1 may be variously embodied to fit the connector 21 of the power adapter 21, which is made subject to one of a variety of models; the adapter connector 32 of the power cable 3 may be variously embodied to fit the connector 411 of the motherboard 41, which is made subject to one of a variety of models. Therefore, the invention enables different models of power adapter 2 to be used with different models of motherboard 41.

As indicated above, the present invention achieves the following advantages:

1. When the power adapter of the server failed and the same model of power adapter is not available, a different model of power adapter can be used and connected to the motherboard of the server through an adapter board and a power cable, enabling the server to function again.
2. When replacing the power adapter or the motherboard of the server with a different model of power adapter or motherboard to fit a different requirement, connect the power output connector of the new model of power adapter to the input-end connector of the adapter board or the connector of the new model of motherboard to the adapter connector of the power cable to complete the installation.
3. By means of the adapter board and the power cable, the power adapter and the motherboard can easily be changed when upgrading the server.
4. When the original power adapter failed, the user can easily install any of a variety of commercially available models of power adapter as a substitute.
5. When the original motherboard failed, the user can easily install any of a variety of commercially available models of power adapter as a substitute.

A prototype of power supply arrangement for server has been constructed with the features of the annexed drawings of FIGS. 1~4. The power supply arrangement for server functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A power supply arrangement for server comprising:

a power adapter installed in a server case holding a motherboard and adapted for providing power supply to said motherboard, said power adapter having a power output connector;

a power cable adapted for transmitting power supply from said power adapter to said motherboards, said power cable having a power connector adapted for receiving power supply from said power adapter and an adapter connector-adapted for connecting to a connector of said motherboard to transmit power supply to said motherboard; and an adapter board mounted in said server case, said adapter board having an input-end connector adapted for connecting to the power output connector of said power adapter to transmit power from said power adapter to said power cable and an output-end connector adapted for connecting to the power connector of said power cable to transmit power from said input-end connector to said power cable.

\* \* \* \* \*